United States Patent [19]

Suzuki et al.

[11] Patent Number: 4,912,013
[45] Date of Patent: Mar. 27, 1990

[54] PHOTOSENSITIVE DIAZO COMPOSITION AND PHOTOSENSITIVE DIAZO LITHOGRAPHIC PRINTING PLATE WITH METAL COMPLEX DYES AND COLOR CHANGING AGENT

[75] Inventors: Norihito Suzuki; Kiyoshi Goto, both of Hino; Yoshihiro Maeda, Yokohama; Shigeki Shimizu, Atsugi, all of Japan

[73] Assignees: Konishiroku Photo Industry Co., Ltd.; Mitsubishi Chemical Industries Limited, both of Tokyo, Japan

[21] Appl. No.: 268,632

[22] Filed: Nov. 8, 1988

Related U.S. Application Data

[63] Continuation of Ser. No. 926,637, Nov. 3, 1986, abandoned.

[30] Foreign Application Priority Data

Nov. 9, 1985 [JP] Japan .................................. 60-251743

[51] Int. Cl.$^4$ ........................... G03C 1/60; G03C 1/94
[52] U.S. Cl. ........................................ 43/157; 430/175; 430/177; 430/178; 430/302
[58] Field of Search ............... 430/175, 157, 178, 177, 430/302

[56] References Cited

U.S. PATENT DOCUMENTS

| | | | |
|---|---|---|---|
| 2,690,968 | 10/1954 | Powers | 430/197 |
| 2,884,326 | 4/1959 | Zemp | 430/178 |
| 3,218,167 | 11/1965 | Metuchen et al. | 430/281 |
| 3,598,585 | 8/1971 | Gaspar | 430/196 |
| 4,299,893 | 11/1981 | Pigeon et al. | 430/157 |
| 4,337,307 | 6/1982 | Neubauer | 430/157 |
| 4,387,151 | 6/1983 | Bosse et al. | 430/175 |
| 4,391,894 | 7/1983 | Shimazu et al. | 430/175 |
| 4,486,529 | 12/1984 | Jeffers et al. | 430/175 |
| 4,576,893 | 3/1986 | Nakakita et al. | 430/175 |
| 4,578,342 | 3/1986 | Sekiya | 430/175 |
| 4,618,553 | 10/1986 | Yuyama et al. | 430/69 |
| 4,692,397 | 9/1987 | Liu | 430/175 |

FOREIGN PATENT DOCUMENTS 1041463  9/1966  United Kingdom ............... 430/191

Primary Examiner—Charles L. Bowers, Jr.
Attorney, Agent, or Firm—Frishauf, Holtz, Goodman & Woodward

[57] ABSTRACT

A photosensitive composition principally comprised of a photosensitive diazo resin and a lipophilic high molecular compound, wherein said photosensitive composition further contains a metal complex dye soluble in an organic solvent. Also disclosed is a photosensitive lithographic printing plate employing such a photosensitive composition.

10 Claims, No Drawings

PHOTOSENSITIVE DIAZO COMPOSITION AND PHOTOSENSITIVE DIAZO LITHOGRAPHIC PRINTING PLATE WITH METAL COMPLEX DYES AND COLOR CHANGING AGENT

This application is a continuation of application Ser. No. 926,637, filed Nov. 3, 1986, abandoned.

BACKGROUND OF THE INVENTION

This invention relates to a photosensitive lithographic printing plate and a photosensitive composition used in such a printing plate. More particularly, it relates to a photosensitive lithographic printing plate having been improved in the loss of dye or pigment (i.e., color fading) in the resist images, which may occur during development, washing with a plate cleaner, printing with ultraviolet curing ink, or the like, and also to a photosensitive composition used in such a printing plate.

Heretofore, photosensitive lithographic printing plates obtained by mixing a diazo resin, a binder resin, etc. to prepare a photosensitive composition, and applying the composition to a hydrophilic metal plate, paper or, preferably, aluminum plate, etc. have been widely utilized in the art.

In such an instance, a coloring matter is incorporated into the photosensitive composition in order to make the images visible during developing or printing. For example, there have been used dyes such as acridine dyes, cyanine dyes, styryl dyes and triphenylmethane dyes, or pigments such as phthalocyanine.

However, these dyes having been conventionally used may cause eluation of dye (loss of dye) from image portions when developing is carried out for a long period of time, particularly when the developing is carried out by repeatedly rubbing a plate surface with a cellulose sponge or the like impregnated with a developing solution, or when washing with a plate cleaner or the like containing an organic solvent, a surface active agent, etc. is repeated during printing, or when printing is carried out with use of ultraviolet (UV) curing ink, and there have been a difficulty in determination of presence of resist image to cause difficulty in practical use.

In the case of the pigments, on the other hand, the loss of pigment may not occur. However, because they are insoluble in the organic solvent used when the photosensitive composition is applied, they are used in the dispersed state to bring about insufficient coating properties, and because they are insoluble in nature, they do not dissolve in the developing solution to give also insufficient developing performances.

SUMMARY OF THE INVENTION

Accordingly, an object of this invention is to eliminate the above drawbacks to provide a photosensitive lithographic printing plate that can give resist images having been improved in the loss of dye, and a photosensitive composition used for such a printing plate.

Another object of this invention is to provide a photosensitive lithographic printing plate which is free from the loss of dye, can achieve good developing performances and can produce good exposure visible images (images made visible by exposure), and a photosensitive composition used for such a printing plate.

The above objects of this invention can be achieved by a photosensitive lithographic printing plate comprising an aluminum plate having a grained and anodically oxidized surface, and thereon a layer of a photosensitive composition principally comprised of a photosensitive diazo resin and a lipophilic high molecular compound and further containing a metal complex dye soluble in an organic solvent; and a photosensitive composition principally comprised of a photosensitive diazo resin and a lipophilic high molecular weight compound, wherein said photosensitive composition further contains a metal complex dye soluble in an organic solvent.

As a result of intensive studies, the present inventors have found that the loss of dye can be remarkably reduced by using a metal complex dye while retaining good developing performances, and thus meet the objects of this invention.

DESCRIPTION OF THE PREFERRED EMBODIMENTS

This invention will be described below more specifically.

The photosensitive diazo resin used in this invention may include, for example, diazo resins obtained by condensation of a diazo compound with an activated carbonyl compound including, for example, formaldehyde, acetoaldehyde, benzaldehyde, etc., in an acidic medium such as sulfuric acid, phosphoric acid and hydrochloric acid, process for preparation of which is disclosed in Photographic Science And Engineering, Vol. 17, p. 33 (1973), U.S. Pat. Nos. 2,063,631, 2,679,498 and 3,050,502, Japanese Unexamined Patent Publication No. 78340/1984, etc.; and diazo resins obtained by condensation of a diazo compound with a diphenyl ether derivative, process for preparation of which is disclosed in Japanese Patent Publication No. 4001/1974.

Taking into consideration the sensitivity, storage stability and the coating strength, the photosensitive diazo resin used in this invention is preferably those containing not less than 20 mole %, more preferably 20 to 60 mole %, of a resin represented by Formula (II) shown below and wherein n in said Formula is 5 or more.

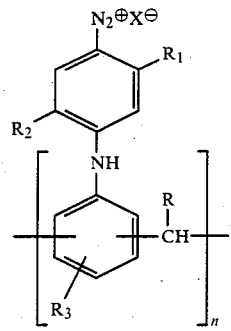

Formula (II)

wherein $R^1$, $R^2$ and $R^3$ each represent a hydrogen atom, an alkyl group or an alkoxy group; R represents a hydrogen atom, an alkyl group or a phenyl group; X represents a counter anion; and n is an integer of 1 to 200. In the formula, the alkyl group and the alkoxy group represented by $R^1$, $R^2$ and $R^3$ may include, for example, an alkyl group having 1 to 5 carbon atoms and an alkoxy group having 1 to 5 carbon atoms, and the alkyl group represented by R may include an alkyl group having 1 to 5 carbon atoms.

Such photosensitive diazo resins can be obtained by polycondensation of a diazonium salt with an aldehyde, for example, paraformaldehyde, acetoaldehyde and benzaldehyde, in sulfuric acid, phosphoric acid or hydrochloric acid, according to the process disclosed in Photographic Science And Engineering, Vol. 17, p. 33 (1973) or U.S. Pat. Nos. 2,063,631 and 2,679,498.

In the polycondensation, the diazonium salt and the aldehydes may be charged in molar ratio of usually 1:0.6 to 1:2, preferably 1:0.7 to 1:1.5, and allowed to react at a low temperature for a short time, for example, at 10° C. or less for about 3 hours, whereby a highly sensitive diazo resin can be obtained.

The counter anion in the diazo resin used in this invention may include anions that may form a salt stable to the diazo resin and also make the resin soluble in an organic solvent. These include organic carboxylic acids such as decanoic acid and benzoic acid, organic phosphoric acids such as phenylphosphoric acid, and sulfonic acid, and typical examples thereof may include aliphatic and aromatic sulfonic acids such as methane sulfonic acid, chloroethane sulfonic acid, dodecane sulfonic acid, benzene sulfonic acid, toluene sulfonic acid and mesitylene sulfonic acid, and anthraquinone sulfonic acid, 2-hydroxy-4-methoxybenzophenone-5-sulfonic acid, hydroquinone sulfonic acid, 4-acetylbenzene sulfonic acid and dimethyl-5-sulfoisophthalate; hydroxyl group containing aromatic compounds such as 2,2',4,4'-tetrahydroxybenzophenone, 1,2,3-trihydroxybenzophenone, 2,2',4-trihydroxybenzophenone; halogenated Lewis acids such as hexafluorophosphoric acid and tetrafluoroboric acid; perhalogenated acids such as $ClO_4$ and $IO_4$; etc., but by no means limited to these. Of these, particularly preferred are hexafluorophosphoric acid and 2-hydroxy-4-methoxybenzophenone-5-sulfonic acid.

The lipophilic high molecular weight compound used in this invention may include polyamide, polyether, polyester, polycarbonate, polystyrene, polyurethane, polyvinyl chloride and a copolymer thereof, polyvinyl butyral resin, polyvinyl formal resin, shellac, epoxy resin, phenolic resin, acrylic resin, etc.

Preferably, there may be included a copolymer having a molecular weight of usually 20,000 to 200,000 of the monomer exemplified by (1) to (12) shown below:

(1) Monomers having an aromatic hydroxyl group, for example, N-(4-hydroxyphenyl)acrylamide or N-(4-hydroxyphenyl)methacrylamide, o-,m-,p-hydroxystyrene, and o-,m-,p-hydroxyphenyl-acrylate or -methacrylate;

(2) Monomers having an aliphatic hydroxyl group, for example, 2-hydroxyethyl acrylate or 2-hydroxyethyl methacrylate;

(3) Alpha- or beta-unsaturated carboxylic acids such as acrylic acid, methacrylic acid and maleic anhydride;

(4) Substituted or unsubstituted alkyl acrylates such as methyl acrylate, ethyl acrylate, propyl acrylate, butyl acrylate, amyl acrylate, hexyl acrylate, octyl acrylate, 2-chloroethyl acrylate, 2-hydroxyethyl acrylate, glycidyl acrylate and N-dimethylaminoethyl acrylate;

(5) Substituted or unsubstituted alkyl methacrylate such as methyl methacrylate, ethyl methacrylate, propyl methacrylate, butyl methacrylate, amyl methacrylate, cyclohexyl methacrylate, 2-hydroxyethyl methacrylate, 4-hydroxybutyl methacrylate, glycidyl methacrylate and N-dimethylaminoethyl methacrylate;

(6) Acrylamides or methacrylamides such as acrylamide, methacrylamide, N-methylol acrylamide, N-methylol methacrylamide, N-ethyl acrylamide, N-hexyl methacrylamide, N-cyclohexyl acrylamide, N-hydroxyethyl acrylamide, N-phenyl acrylamide, N-nitrophenyl acrylamide and N-ethyl-N-phenyl acrylamide;

(7) Vinyl ethers such as ethyl vinyl ether, 2-chloroethyl vinyl ether, hydroxyethyl vinyl ether, propyl vinyl ether, butyl vinyl ether, octyl vinyl ether and phenyl vinyl ether;

(8) Vinyl esters such as vinyl acetate, vinyl chloroacetate, vinyl butyrate and vinyl benzoate;

(9) Styrenes such as styrene, α-methylstyrene, methylstyrene and chloromethylstyrene;

(10) Vinyl ketones such as methyl vinyl ketone, ethyl vinyl ketone, propyl vinyl ketone and phenyl vinyl ketone;

(11) Olefins such as ethylene, propylene, isobutylene, butadiene and isoprene; and

(12) N-vinylpyrrolidone, N-vinylcarbazole, 4-vinylpyridine, acrylonitrile, methacrylonitrile, etc.

The copolymer may be further copolymerized with a monomer copolymerizable with the above monomers. The copolymer obtained by copolymerization of the above monomers may also include those modified with glycidyl methacrylate, glycidyl acrylate, etc., but is by no means limited to these.

More specifically, the copolymer preferably includes copolymers having a hydroxyl group, containing the monomers listed in the above (1) and (2), and more preferably the copolymers having an aromatic hydroxyl group.

To the above copolymer, polyvinyl butyral resin, polyurethane resin, polyamide resin, epoxy resin, novolac resin, natural resin, etc., may be further added if necessary.

The lipophilic high molecular weight compound used in this invention is contained in the photosensitive composition in an amount of usually 40 to 99% by weight, preferably 50 to 95% by weight. Also, the photosensitive diazo resin used in this invention is contained in an amount of usually 1 to 60% by weight, preferably 3 to 30% by weight.

The metal complex dye which is soluble in an organic solvent, used in this invention may include a metal complex compound represented by Formula (I) shown below or a modified compound of copper phthalocyanine.

Formula (I)

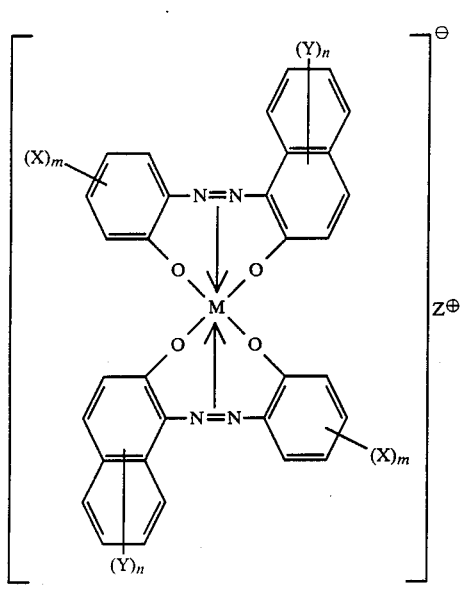

In the formula, X and Y each represent a hydrogen atom, an alkyl group having 1 to 10 carbon atoms, an alkoxy group having 1 to 4 carbon atoms, an alkoxycarbonyl group having 2 to 5 carbon atoms, an acyl group having 2 to 5 carbon atoms, an aminocarbonyl group, an alkyl aminocarbonyl group having 2 to 5 carbon atoms, an alkyl sulfonyl group having 1 to 3 carbon atoms, an aminosulfonyl group, an acylamino group having 2 to 5 carbon atoms, a nitro group, a cyano group or a halogen group; m represents an integer of 1 to 4; n represents an integer of 1 to 6; and X and Y each may be the same or different when m and n each are two or more. $Z^\oplus$ represents a cation; and M represents a cobalt atom, a nickel atom or a chromium atom.

In Formula (I), the cation represented by $Z^\oplus$ is preferably a cation represented by $R^4R^{4'}NH_2$, wherein $R^4$ and $R^{4'}$ each represent an alkyl group having 1 to 20 carbon atoms or a hydroxyalkyl group.

Examples of the metal complex dye soluble in an organic solvent, used in this invention and represented by the above Formula (I) are shown below, but by no means limited to these.

Exemplary Compounds
(1) Aizen Spilon Violet RH (Color Index No. C.I. Solvent Violet 21)
A 2:1 chromium complex of;

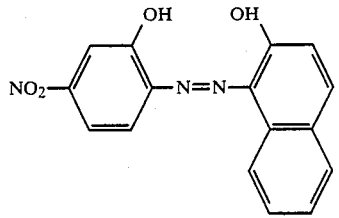

(2) Vialon Fast Black 63 (Color Index No. C.I. Acid Black 63)
A 2:1 chromium complex of;

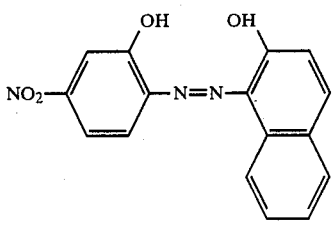

(3) Orasol Violet 3 B (Color Index No. C.I. Solvent Violet 1)
A 2:1 cobalt complex of;

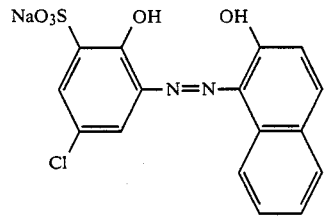

(4) Solian Violet BL (Color Index No. C.I. Acid Violet 91)
A 2:1 cobalt complex of;

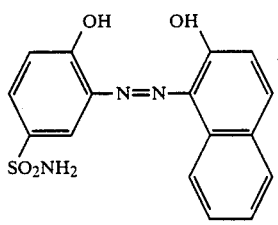

(5) Vialon Fast Rubine BL (Color Index No. C.I. Solvent Red 102)
A 2:1 chromium complex of;

The modified compound of copper phthalocyanine, which is another metal complex dye preferably used in this invention, may include a compound wherein a substituent represented by Formula (III) or Formula (IV) shown below has been introduced into benzene or naphthalene rings in the copper phthalocyanine.

$$-SO_2NHR^5 \qquad \text{Formula (III)}$$

$$-SO_2NH-R^6-O-R^5 \qquad \text{Formula (IV)}$$

In Formulae (III) and (IV), $R^5$ represents a hydrogen atom or an alkyl group having 1 to 10 carbon atoms, and $R^6$ represents an alkylene group having 1 to 10 carbon atoms.

Examples of the metal complex dye of the modified compound of copper phthalocyanine used in this invention are shown below, but by no means limited to these.

Exemplary Compounds:

(6) CuPC${-}$[SO$_2$NHC$_3$H$_6$OC$_3$H$_7$]$_2$ $_{to\ 3}$
(wherein CuPC represents the copper phthalocyanine structure; same in the following)

(7) Zapon Fast Blue HFL (C.I. Solvent Blue 25) CuPC${-}$[SO$_2$NHC$_3$H$_6$CH(CH$_3$)$_2$]$_2$ $_{to\ 3}$ SO$_3^\ominus$NH$_3^\oplus$C$_3$H$_6$CH(CH$_3$)$_2$]$_2$ $_{to\ 1}$ (8) Zapon Fa B HL (C.I. Solvent Blue 24)
(9) Zapon Fast Blue FLT (C.I. Solvent Blue 55)
(10) Neozapon Blue FLE (C.I. Solvent Blue 70)

The metal complex dye soluble in an organic solvent, used in this invention, is preferably contained in solids of the photosensitive composition in an amount of usually 0.1 to 10% by weight, more preferably 1 to 5% by weight.

In the photosensitive composition of this invention, there can be used a color changing agent which may change a tone (color tone) by reaction with a free radical or an acid. The color changing agent is used for the purpose of obtaining images made visible by exposure (i.e., exposure visible images).

As the color changing agent, any of those which may change a tone by reacting with a free radical or an acid can be used. Here, "change a tone" is meant to include either of the change from colorless to colored tone and the change from colored to colorless or differently colored tone. Preferable color changing agent includes those which may change the tone by the formation of a salt with an acid.

For example, the color changing agent for the change from colored tone to colorless or differently colored tone may include triphenylmethane, diphenylmethane, oxadine, xanthene, iminonaphthoquinone, azomethine or anthraquinone dyes, typified by Victoria Pure Blue BOH (trade name, produced by Hodogaya Chemical Co., Ltd.), Oil Blue No. 603 (trade name, produced by Orient Chemical Industries Co., Ltd.), Patent Pure Blue (trade name, produced by Sumitomo Mikuni Chemical Co., Ltd.), Crystal Violet (Color Index No. C.I. Basic Violet 3), Brilliant Green (Color Index No. C.I. Basic Green 1), Ethyl Violet (Color Index No. C.I. Basic Violet 4), Methyl Violet (Color Index No. C.I. Basic Violet 1), Methyl Green (Color Index No. C.I. Basic Blue 20), Erythrosine B (Color Index No. C.I. Acid Red 51), Basic Fuchsine (Color Index No. C.I. Basic Violet 14), Malachite Green (Color Index No. C.I. Basic Green 4), Oil Red (Color Index No. C.I. Solvent Red 24), m-cresol purple, Rhodamine B (Color Index No. C.I. Basic Violet 10), Auramine (Color Index No. C.I. Basic Yellow 2), 4-p-diethylaminophenyl iminonaphthoquinone, cyano-p-diethylaminophenyl acetoanilide, etc.

On the other hand, the color changing agent for the change from colorless to colored tone may include leuco dyes, and primary or secondary arylamines typified, for example, by triphenylamine, diphenylamine, o-chloroaniline, 1,2,3-triphenylguanidine, naphthylamine, diaminodiphenylmethane, p,p'-bis-dimethylaminodiphenylamine, 1,2-dianilinoethylene, p,p',p''-tris-dimethylaminotriphenylmethane, p,p'-bis-dimethylaminodiphenyl methylimine, p,p',p''-triamino-o-methyltriphenylmethane, p,p-bis-dimethylaminodiphenyl-4-anilinonaphthylmethane and p,p',p''-triaminotriphenylmethane.

Effectively used are particularly preferably triphenylmethane and diphenylmethane dyes, more preferably triphenylmethane dyes, and particularly Victoria Pure Blue BOH.

The above color changing agent may be preferably contained in the photosensitive composition in an amount of usually about 0.5 to about 10% by weight, more preferably about 1 to 5% by weight.

The photosensitive composition of this invention may further contain various additives.

For example, they may include alkyl ethers (e.g., ethyl cellulose and methyl cellulose) for improving the coating properties, fluorine surface active agents or nonionic surface active agents [e.g., Pluronic L-64 (trade name, produced by Asahi Denka K.K.)], plasticizer (e.g., butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate and oligomers and polymers of acrylic or methacrylic acids) for imparting flexibility and abrasion resistance of a coating, oleophilizing agents (e.g., a styrene/maleic anhydride copolymer half-esterified with alcohol, disclosed in Japanese Unexamined Patent Publication No. 527/1980) for improving the oleophilicity of image portions, stabilizers (e.g., phosphoric acid, phosphorous acid, and organic acids such as citric acid, oxalic acid, benzenesulfonic acid, naphthalenesulfonic acid, 4-methoxy-2-hydroxybenzophenone-5-sulfonic acid and tartaric acid), etc. These additives may be added in an amount varied depending on the purpose for which they are used, but, in general, in an amount of 0.01 to 30% by weight based on total solids.

To provide such a photosensitive composition on a support to form a layer, the above diazo resin and optionally a variety of additives in predetermined amounts may be dissolved in a suitable solvent (such as methyl "Cellosolve", ethyl "Cellosolve", methyl "Cellosolve" acetate, acetone, methyl ethyl ketone, methanol, dimethyl formamide, dimethyl sulfoxide, water, or a mixture of any of these) to prepare a coating solution of the photosensitive composition, which may be then applied or coated on the support and dried. When coating, the concentration of the photosensitive composition is preferably in the range of 1 to 50% by weight. In this instance, the coating amount of the photosensitive composition may be about 0.2 to 10 g/m$^2$.

As the support to be coated with the photosensitive composition of this invention, there may be used various kinds of supports, but preferably an aluminum plate when used in the photosensitive lithographic printing plate. However, if the aluminum plate is used without any treatment, there can be accompanied with the defects that the adhesion of the photosensitive composition is poor and the photosensitive composition is decomposed. To eliminate such defects, various proposals have been made heretofore.

For example, there have been proposed a method in which the surface of an aluminum plate, having been grained, is treated with silicate (U.S. Pat. No. 2,714,066), a method in which the same is treated with an organic acid salt (U.S. Pat. No. 2,714,066), a method in which it is treated with sulfonic acid and a derivative thereof (U.S. Pat. No. 3,220,832), a method in which it is treated with potassium hexafluorozirconate (U.S. Pat. No. 2,946,683), a method in which it is anodized, a method in which it is treated with an aqueous solution of a silicate of an alkali metal (U.S. Pat. No. 3,181,461), etc.

In this invention, the aluminum plate (including an alumina-laminated plate; having the same meaning hereinafter) is degreased from its surface, and thereafter grained by a brush polishing, a ball polishing, a chemical polishing or an electrolytic etching, preferably by the electrolytic etching which can obtain a deep and uniformly grained surface. Anodizing treatment is carried out, for example, by passing electric currents, using the aluminum plate as an anode, through an aqueous solution obtained by mixing one or more of inorganic salts of phosphoric acid, chromic acid, boric acid, sulfuric acid or the like or organic acids such as oxalic acid, preferably in an aqueous solution of sulfuric acid. Anodized coating amount is preferably 5 to 60 mg/dm$^2$, more preferably 5 to 30 mg/dm$^2$.

Sealing treatment applied in this invention is carried out by immersion in an aqueous solution of sodium silicate with a concentration of 0.1 to 3%, at a temperature of 80° to 95° C. for 10 seconds to 2 minutes, preferably followed by treatment by immersion in water of 40° to 95° C. for 10 seconds to 2 minutes.

The photosensitive material applied on the support is processed by conventional methods. Namely, it is exposed to light through a transparent original having linear images, dot images and so on, followed by development with an aqueous developing solution to obtain relief images which are negative to the original. Light source suitable for the exposure may include a carbon arc lamp, a mercury lamp, a xenon lamp, a metal halide lamp, a strobe, etc.

The developing solution used in the developing of the photosensitive lithographic printing plate of this invention may be any of those known in the art, but preferably the following is used. That is, the developing solution for developing the photosensitive lithographic printing plate of this invention contains a particular organic solvent, an alkali agent and water as essential components. Here, the particular organic solvent refers to an organic solvent which can dissolve or swell unexposed portions (non-image portions) of the above photosensitive composition layer when it is contained in the developing solution, and also shows a solubility to water at a room temperature (20° C.), of 10% by weight or less. Such organic solvent may be any of those having the properties as mentioned above, and may not limited to the following, shown as examples, which includes carboxylates such as ethyl acetate, propyl acetate, butyl acetate, amyl acetate, benzyl acetate, ethylene glycol monobutyl acetate, butyl lactate and butyl levulinate; ketones such as ethyl butyl ketone, methyl isobutyl ketone and cyclohexane; alcohols such as ethylene glycol monobutyl ether, ethylene glycol benzyl ether, ethylene glycol monophenyl ether, benzyl alcohol, methyl phenyl carbinol, n-amyl alcohol and a methyl amyl alcohol; alkyl substituted aromatic hydrocarbons such as xylene; halogenated hydrocarbons such as methylene dichloride, ethylene dichloride and monochlorobenzene, etc. One or more of these organic solvents may be used. Among these organic solvents, particularly effective are ethylene glycol monophenyl ether and benzyl alcohol. These organic solvents may be contained in the developing solution in an amount of about 1 to 20% by weight, and, in particular, more preferable results can be obtained when it is in amount of 2 to 10% by weight.

On the other hand, the alkali agent contained in the developing solution as an essential component may include; (A) inorganic alkali agents such as sodium silicate, potassium silicate, potassium hydroxide, sodium hydroxide, lithium hydroxide, sodium or ammonium salts of secondary or tertiary phosphoric acid, sodium methasilicate, sodium carbonate and ammonia; and (B) organic amine compounds such as mono-, di- or trimethylamine, mono-, di- or triethylamine, mono- or diisopropylamine, n-butylamine, mono-, di- or triethanolamine, mono-, di- or triisopropanolamine, ethyleneimine and ethylenediamine.

These alkali agents may be contained in the developing solution in an amount of usually 0.05 to 4% by weight, preferably 0.5 to 2% by weight.

To more enhance the storage stability, the print resistance and so on, a water soluble sulfite is preferably contained in the developing solution. Such a water soluble sulfite is preferably an alkali or alkaline earth metal salt of sulfite, including, for example, sodium sulfite, potassium sulfite, lithium sulfite, magnesium sulfite, etc. These sulfites may be contained in the developing solution composition in an amount of usually 0.05 to 4% by weight, preferably 0.1 to 1% by weight.

To assist the dissolution of the above organic solvent in water, a certain solubilizing agent may be contained in the developing solution. As such a solubilizing agent, low molecular alcohols or ketones more readily water soluble than the organic solvent to be used are preferably used to achieve the intended effects of this invention. Anionic surface active agents, amphoteric surface active agents, etc. may also be used. As such low molecular alcohols or ketones preferably used are, for example, methanol, ethanol, propanol, butanol, acetone, methyl ethyl ketone, ethylene glycol monomethyl ether, ethylene glycol monoethyl ether, methoxybutanol, ethoxybutanol, 4-methoxy-4-methylbutanol, N-methylpyrrolidone, etc. Also, the surface active agents preferably include, for example, sodium isopropylnaphthalene sulfonate, sodium n-butylnaphthalene sulfonate, sodium N-methyl-N-pentadecyl aminoacetate, sodium lauryl sulfate, etc. There is no particular limitation to the amount of the solubilizing agents such as these alcohols and ketones, but, in general, it is preferably about 30% by weight or less based on the total amount of the developing solution.

When the photosensitive lithographic printing plate according to this invention is immersed or rubbed in the above developing solution kept at a room temperature to about 40° C., after having been subjected to imagewise exposure, the photosensitive composition at unexposed portions can be completely removed in 10 to 60 seconds, without adversely affecting exposed portions on the photosensitive composition layer and thus the printing plate obtained. Here, developability and storage stability of the photosensitive lithographic printing plate according to this invention are excellent. The printing plate obtained above has a long press-life. Moreover, there is not any loss of dye or any lowering of quality of the printing plate. Still moreover, there is no problem from the viewpoint of environmental pollution and industrial hygiene.

Examples for syntheses of the diazo resin and the lipophilic high molecular weight compound of this invention, and also production of the support, are shown below:

Synthesis of Lipophilic High Molecular Weight Compound 1

In 112 ml of a 1:1 mixed solvent of acetone and methanol, 10.0 g of N-(4-hydroxyphenyl)methacrylamide, 25 g of acrylonitrile, 60 g of ethyl acrylate, 5 g of methacrylic acid and 1.624 g of azobisisobutylonitrile were dissolved, and, after replacement with nitrogen, the solution was heated at 60° C. for 8 hours.

After the reaction was completed, the reaction mixture was poured into 5 lit. of water with stirring, and white precipitates thus produced were collected by filtration, followed by drying to obtain 90 g of Lipophilic High Molecular Weight Compound 1.

Molecular weight of this Lipophilic High Molecular Weight Compound 1 was measured by gel permeation chromatography (hereinafter simplified as GPC) to reveal that its weight average molecular, weight was 85,000.

Synthesis of Lipophilic High Molecular Weight Compound 2

A solution comprising a mixture of 50.0 g of 2-hydroxyethyl methacrylate, 20 g of acrylonitrile, 25 g of methyl methacrylate, 5 g of methacrylic acid and 1.2 g of benzoyl peroxide was dropwise added over 2 hours to 300 g of ethylene glycol monomethyl ether heated to 100° C. After the addition was completed, 300 g of ethylene glycol monomethyl ether and 0.3 g of benzoyl peroxide were further added and the reaction was continued for another four hours. After the reaction was completed, the reaction mixture was diluted with methanol and poured into 5 lit. of water with stirring, and white precipitates thus produced were collected by filtration, followed by drying to obtain 90 g of Lipophilic High Molecular Weight Compound 2.

Molecular weight of this Lipophilic High Molecular Weight Compound 2 was measured by GPC to reveal that its weight average molecular weight was 65,000.

Synthesis of Lipophilic High Molecular Weight Compound 3

A solution comprising a mixture of 45 g of 2-hydroxyethyl methacrylate, 10 g of acrylonitrile, 35 g of ethyl methacrylate, 10 g of methacrylic acid and 1.2 g of benzoyl peroxide was dropwise added to ethylene glycol monomethyl ether in the same manner as in the synthesis of Lipophilic High Molecular Weight Compound 2 to obtain 90 g of Lipophilic High Molecular Weight Compound 3.

Molecular weight of this Lipophilic High Molecular Weight Compound 3 was measured by GPC to reveal that its weight average molecular weight was 62,000.

Synthesis of Diazo Resin 1

In 40.9 g of conc. sulfuric acid, 14.5 g (50 millimoles) of p-diazodiphenylamine sulfate were dissolved. To the reaction mixture thus formed, 1.5 g (50 millimoles) of paraformaldehyde were slowly added. Here, the addition was carried out so as not to bring about the reaction temperature exceeding 10° C. Thereafter, the reaction mixture was stirred continuously for 2 hours under ice cooling.

The reaction mixture was then dropwise added to 500 ml of ethanol under ice cooling, and precipitates produced were filtered. After washing with ethanol, the precipitates were dissolved in 100 ml of pure water, and to the solution obtained a cooled conc. aqueous solution in which 6.8 g of zinc chloride were dissolved in water was added. Precipitates produced were filtered, and thereafter washed with ethanol, and then dissolved in 150 ml of pure water. To the solution obtained, a cooled conc. aqueous solution in which 8 g of ammonium hexafluorophosphate were dissolved in water was added. Precipitates thus produced were collected by filtration and washed with water, followed by drying overnight at 30° C. to obtain Diazo Resin 1.

Molecular weigh of this Diazo Resin 1 was measured by GPC to reveal that hexamers or more were contained therein in about 50 mole %.

Production of Aluminum Plate 1

With use of a nylon brush and a suspension of 400 mesh pamistone and water, the surface of an aluminum plate was grained, and then thoroughly washed with water, immersed in a 1% sodium hydroxide solution for 13 seconds, anodically oxidized in a 40% phosphoric acid solution at 30° C. under a current density of 4.0 $A/dm^2$ for 30 seconds, treated with sodium silicate by immersing in a 1% sodium metasilicate solution at 85° C. for 3 minutes, and thereafter successively immersed in hot water of 90° C. for 2 minutes, followed by washing with water and drying to produce Aluminum Plate-1.

Production of Aluminum Plate 2

An aluminum plate of 0.2 mm thick was degreased by immersing it in an aqueous solution of 3% sodium hydroxide, followed by washing with water, and thereafter electrolytically etched in an aqueous solution of 1% hydrochloric acid and 1% boric acid at 25° C. under 3 $A/dm^2$ for 5 minutes, followed by washing with water, and thereafter anodized in an aqueous solution of 40% sulfuric acid at 30° C. under 1.5 $A/dm^2$ for 2 minutes, washed with water, immersed in an aqueous solution of 1% sodium silicate of 85° C. for 37 seconds, immersed in hot water (pH 8.5) of 90° C. for 25 seconds, washed with water, and then dried to obtain Aluminum Plate-2.

EXAMPLES

This invention will be described more specifically by the following Examples, but by no means limited to these Examples.

EXAMPLE 1

Aluminum Plates-1 or -2 produced in the above were coated with coating solutions of the photosensitive compositions 1 to 12 shown in Table 1 below by use of a whirler. The above coating solutions of the photosensitive compositions 1 to 12 were prepared by dissolving the photosensitive compositions indicated in Table 1 (lipophilic high molecular weight compound, diazo resin, color changing agent, metal complex dye and polyacrylic acid) into 180 ml of methyl "Cellosolve" as a solvent. Thereafter, the coated plates were dried at a temperature of 85° C. for 3 minutes to obtain photosensitive lithographic printing plates, Samples 1 to 12. The amount of coating was 1.5 $g/m^2$ in dried weight.

TABLE 1

| Sample No. | Aluminum plate No. | Photo-sensitive composition coating solution No. | Lipophilic high molecular compound No. (10 g) | Diazo resin No. (1 g) | Color changing agent No. (0.2 g) | Metal complex dye No. (0.4 g) | Polyacrylic acid (additive) (0.6 g) |
|---|---|---|---|---|---|---|---|
| 1 | 1 | 1 | 1 | 1 | 1 | (1) | 1 |
| 2 | 2 | 2 | 2 | 1 | 1 | (1) | 1 |
| 3 | 2 | 3 | 3 | 1 | 1 | (1) | 1 |
| 4 | 1 | 4 | 1 | 1 | 1 | (6) | 1 |
| 5 | 2 | 5 | 2 | 1 | 1 | (6) | 1 |
| 6 | 2 | 6 | 3 | 1 | 1 | (6) | 1 |
| 7 | 1 | 7 | 1 | 1 | 1 | none | 1 |
| 8 | 2 | 8 | 3 | 1 | 1 | none | 1 |
| 9 | 1 | 9 | 1 | 1 | 2 | none | 1 |
| 10 | 1 | 10 | 1 | 1 | none | (1) | none |
| 11 | 1 | 11 | 1 | 1 | 1 | (1) | none |
| 12 | 1 | 12 | 1 | 1 | none | (1) | 1 |

In the above Table 1, the color changing agents and polyacrylic acids used are those shown below, and the metal complex dyes correspond to those exemplified herein.

Color Changing Agent-1: Victoria Pure Blue BOH (Produced by Hodogaya Chemical Co., Ltd.)
Color Changing Agent-2: Copper phthalocyanine dye
Polyacrylic Acid-1: Polyacrylic acid produced by Nihon Junyaku Co., Ltd.; trade name: Julimer AC-10L Photosensitive lithographic printing plates Nos. 1 to 12 obtained were exposed to light of a 3 kW ultra-high pressure mercury lamp at a distance of 60 cm for 30 seconds, and developed by immersing in the following Developer-1 at 25° C. for 20 seconds to obtain samples of lithographic printing plates. Optical density of a solid image portion with the size of 10 mm × 10 mm for each of the plates was measured with a red filter.

| [Makeup of Developer-1] | |
|---|---|
| Benzyl alcohol | 50 g |
| Triethanolamine | 15 g |
| Sodium sulfite | 5 g |
| Sodium butyl naphthalenesulfonate | 25 g |
| Water | 1,000 g |

Also, the above photosensitive lithographic printing plates Nos. 1 to 12 were similarly exposed, and developed by double-stroking the surface of printing plates 20 times with use of a cellulose spongy impregnated with Developer-1 to obtain samples of lithographic printing plates. Density of solid images was similarly measured to calculate the dye retention (Dye Retension-1) under overdevelopment. The retension can be obtained by the following formula:

$$\text{Retension (\%)} = \frac{\text{(Optical Density of solid images } - \text{ Optical density of nonimage area)}}{\text{Optical density of solid images in 20 seconds development } - \text{ Optical density of nonimage area}} \times 100$$

Samples of lithographic printing plates obtained by 20 second development were set in a printing machine, and the plates were washed for each 1,000 plates with an ultra plate cleaner produced by ABC Chemical Co., Ltd. Printing was carried out for 10,000 sheets, and the dye retention in the solid images (Dye Retension-2) was similarly calculated.

Also, samples of lithographic printing plates obtained by 20 minutes development were set to a printing machine, and printing was carried out for 20,000 sheets by using as ink an ultraviolet curing ink FD-OL-Red (trade name, produced by Toyo Ink Mfg. Co., Ltd.). The dye retension in the solid images (Dye Retension-3) was similarly calculated.

Further, 10 m² of photosensitive lithographic printing plate was developed with 1 lit. of Developer-1 and exhausted developer was obtained. Then, the photosensitive lithographic printing plates Nos. 1 to 12 were exposed similarly and developed with the exhausted developer obtained in the above at 25° C. for 20 seconds, and lithographic printing plates obtained were set to a printing machine to carry out printing to observe the presence of surface stains.

Results of the above are shown in Table 2.

TABLE 2

| Sample No. | Photo-sensitive composition coating solution No. | Dye retention (%) 1 | 2 | 3 | Surface stains | Exposed visible images |
|---|---|---|---|---|---|---|
| 1 (This invention) | 1 | 87 | 82 | 80 | none | good |
| 2 (This invention) | 2 | 85 | 80 | 75 | none | good |
| 3 (This invention) | 3 | 81 | 80 | 73 | none | good |
| 4 (This invention) | 4 | 79 | 75 | 75 | none | good |
| 5 (This invention) | 5 | 75 | 73 | 73 | none | good |
| 6 (This invention) | 6 | 70 | 71 | 70 | none | good |
| 7 (Comparison) | 7 | 50 | 43 | 30 | none | good |
| 8 (Comparison) | 8 | 42 | 39 | 25 | none | good |
| 9 (Comparison) | 9 | 90 | — | — | present | poor |
| 10 (This invention) | 10 | 91 | 88 | 85 | none | poor |
| 11 (This invention) | 11 | 88 | 81 | 78 | none | good |
| 12 (This invention) | 12 | 90 | 87 | 83 | none | poor |

In Example 9, printing could not be carried out because of the surface stains.

It is seen from the above results that the photosensitive lithographic printing plate employing the photosensitive composition of this invention shows good developing performances and much better dye retension as compared with conventional ones.

We claim:

1. A photosensitive lithographic printing plate comprising an aluminum plate made to have a sandy surface and having been subjected to anodic oxidation on the surface, and a layer provided thereon, of a photosensitive composition comprised of a photosensitive diazo resin which is a polycondensation product of a diazonium salt with an aldehyde; a color changing agent which changes tone by reaction with an acid; and a binder comprising a lipophilic high molecular weight compound having a hydroxyl group and a carboxylic acid group and further containing 0.1 to 10% by weight, based on a solids content, of a metal complex dye soluble in an organic solvent and wherein said metal complex dye is a metal complex dye represented by formula (I) below:

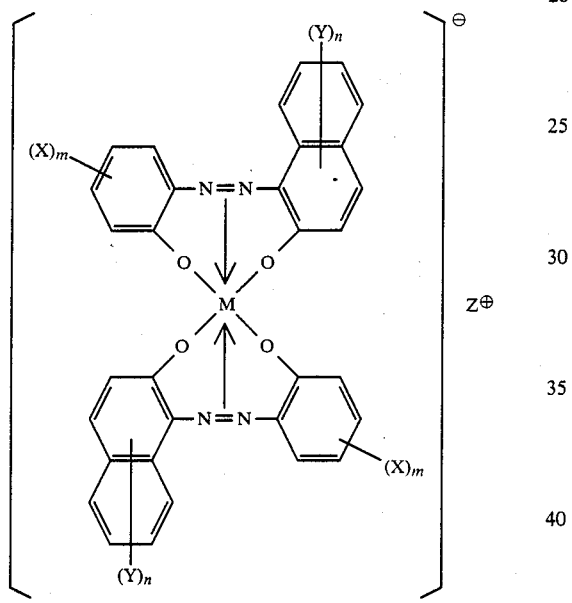

wherein X and Y each represent a hydrogen atom, an alkyl group having 1 to 10 carbon atoms, an alkoxy group having 1 to 4 carbon atoms, an alkoxycarbonyl group having 2 to 5 carbon atoms, an acyl group having 2 to 5 carbon atoms, an aminocarboyl group, an alkyl aminocarbonyl group having 2 to 5 carbon atoms, an alkyl sulfonyl group having 1 to 3 carbon atoms, an aminosulfonyl group, an acylamino group having 2 to 5 carbon atoms, a nitro group, a cyano group or a halogen group; m represents an integer of 1 to 4; n represents an integer of 1 to 6; X and Y each may be the same or different when m and n each are two or more; Z⊕ represents a cation; and M represents a cobalt atom or a chromium atom.

2. In a photosensitive composition of the type used for forming a photosensitive layer on lithographic plates and being comprised of a photosensitive diazo resin which is a polycondensation product of a diazonium salt with an aldehyde, a color changing agent which changes tone by reaction with an acid and a binder compound, said photosensitive composition further including a dye incorporated thereinto, to make images visible during the development or printing of an image to which the photosensitive layer has been exposed, the improvement wherein said dye is a metal complex dye solution in an organic solvent, and said binder compound is a lipophilic high molecular weight compound having a hydroxyl group and a carboxylic acid group and wherein said metal complex dye is a metal complex dye represented by Formula (I) below:

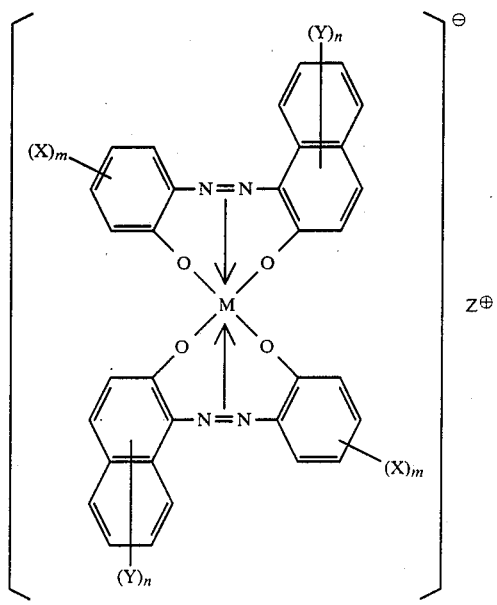

wherein X and Y each represent a hydrogen atom, an alkyl group having 1 to 10 carbon atoms, an alkoxy group having 1 to 4 carbon atoms, an alkoxycarbonyl group having 2 to 5 carbon atoms, an acyl group having 2 to 5 carbon atoms, an aminocarboyl group, an alkyl aminocarbonyl group having 2 to 5 carbon atoms, an alkyl sulfonyl group having 1 to 3 carbon atoms, an aminosulfonyl group, an acylamino group having 2 to 5 carbon atoms, a nitro group, a cyano group or a halogen group; m represents an integer of 1 to 4; n represents an integer of 1 to 6; X and Y each may be the same or different when m and n each are two or more; Z⊕ represents a cation; and M represents a cobalt atom or a chromium atom.

3. The photosensitive composition of claim 2 wherein the dye is present in an amount of 1 to 5% by weight, based on a solids content.

4. The photosensitive composition of claim 3 wherein the binder has a molecular weight in the range of 20,000 to 200,000.

5. In a photosensitive composition of the type used for forming photosensitive layer on lithographic plates and being comprised of a photosensitive diazo resin which is a polycondensation product of a diazomium salt with an aldehyde a color changing agent which changes tone by reaction with an acid and a binder compound, the improvement wherein said photosensitive layer further comprises 0.1 to 10% by weight, based on a solids content, of metal complex dye soluble in an organic solvent and being operable to make images visible during development or printing of an image to which the photosensitive layer has been exposed, and said binder compound is a lipohilic high molecular weight compound having a hydroxyl group and a carboxylic acid group, and wherein said metal complex dye is a metal complex dye represented by Formula (I) below:

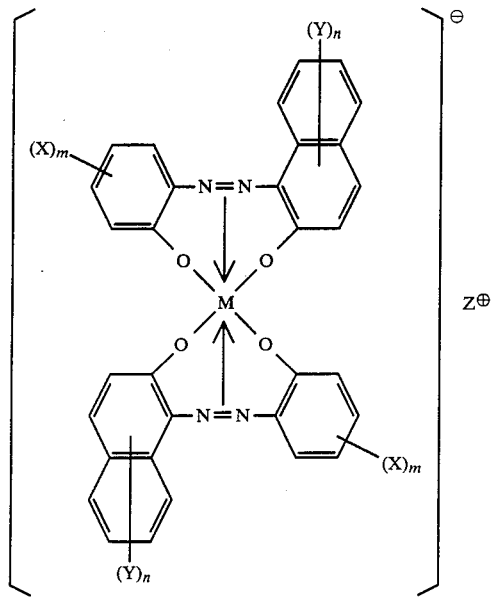

wherein X and Y each represent a hydrogen atom, an alkyl group having 1 to 10 carbon atoms, an alkoxy group having 1 to 4 carbon atoms, an alkoxycarbonyl group having 2 to 5 carbon atoms, an acyl group having 2 to 5 carbon atoms, an aminocarboyl group, an alkyl aminocarbonyl group having 2 to 5 carbon atoms, an alkyl sulfonyl group having 1 to 3 carbon atoms, an aminosulfonyl group, an acylamino group having 2 to 5 carbon atoms, a nitro group, a cyano group, or a halogen group; m represents an integer of 1 to 4; n represents an integer of 1 to 6; X and Y each may be the same or different when m and n each are two or more; $Z^{\oplus}$ represents a cation; and M represents a cobalt atom or a chromium atom.

6. The photosensitive composition of claim 5 wherein the dye is present in an amount of 1 to 5% by weight, based on a solids content.

7. The photosensitive composition of claim 6 wherein the binder has a molecular weight in the range of 20,000 to 200,000.

8. The composition of claim 5,
wherein the high molecular weight compound is a copolymer formed by reacting, in parts by weight, 10 parts N-(4-hydroxyphenol) methacrylamide, 25 parts acrylonitrile, 60 parts ethylacrylate and 5 parts methylacrylic acid.

9. The composition of claim 5,
wherein the high molecular weight compound is a copolymer formed by reacting, in parts by weight, 50 parts 2-hydroxyethyl methacrylate, 20 parts acrylonitrile, 25 parts methylmethacrylate and 5 parts methacrylic acid.

10. The composition of claim 5,
wherein the high molecular weight compound is a copolymer formed by reacting, in parts by weight, 45 parts 2-hydroxyethyl methacrylate; 10 parts acrylonitrile; 35 parts ethyl methacrylate and 10 parts methacrylic acid.

* * * * *